(12) United States Patent
Hosseini et al.

(10) Patent No.: US 11,215,852 B2
(45) Date of Patent: Jan. 4, 2022

(54) OPTICAL DEVICE WITH THERMALLY SWITCHING PHASE CHANGE MATERIAL

(71) Applicant: BODLE TECHNOLOGIES LIMITED, Oxford (GB)

(72) Inventors: Peiman Hosseini, Bicester (GB); Harish Bhaskaran, Oxford (GB); Ben Broughton, Oxford (GB)

(73) Assignee: BODLE TECHNOLOGIES LIMITED, Oxford (GB)

( * ) Notice: Subject to any disclaimer, the term of this patent is extended or adjusted under 35 U.S.C. 154(b) by 232 days.

(21) Appl. No.: 16/074,471

(22) PCT Filed: Jan. 25, 2017

(86) PCT No.: PCT/IB2017/000041
§ 371 (c)(1),
(2) Date: Aug. 1, 2018

(87) PCT Pub. No.: WO2017/134506
PCT Pub. Date: Aug. 10, 2017

(65) Prior Publication Data
US 2019/0064555 A1 Feb. 28, 2019

(30) Foreign Application Priority Data

Feb. 4, 2016 (EP) .................................... 16000280

(51) Int. Cl.
*G02F 1/01* (2006.01)
*H01L 23/34* (2006.01)
*H01L 27/12* (2006.01)

(52) U.S. Cl.
CPC ...... *G02F 1/0147* (2013.01); *G02F 2203/055* (2013.01); *G02F 2203/34* (2013.01); *H01L 23/345* (2013.01); *H01L 27/1255* (2013.01)

(58) Field of Classification Search
CPC ............... G02F 1/0147; G02F 2203/34; G02F 2203/055; H01L 27/1255; H01L 23/345
See application file for complete search history.

(56) References Cited

U.S. PATENT DOCUMENTS 5,418,640 A 5/1995 Hood
5,761,188 A 6/1998 Rosen et al.
(Continued)

FOREIGN PATENT DOCUMENTS

CN 1167313 A 12/1997
CN 1250528 A 4/2000
(Continued)

OTHER PUBLICATIONS

International Preliminary Report on Patentability for International Application No. PCT/IB2017/000041, dated Aug. 16, 2018.
(Continued)

*Primary Examiner* — Jack Dinh
(74) *Attorney, Agent, or Firm* — Jason H. Vick; Sheridan Ross, PC

(57) ABSTRACT

The present invention is notably directed to an optical device (1) comprising a layer structure (2) with: a thermally conducting, optical reflector (15); a thermally conducting spacer (14), which is transmissive to light and arranged above the reflector (15); and a phase change material (10), or PCM, arranged above the spacer (14) and having at least two reversibly switchable states, in which the PCM exhibits two different values of refractive index. The reflector (15), the spacer (14) and the PCM (10) are successively stacked along a stacking direction (z) of the layer structure. The optical device further comprises: a heating element (17), opposite to the PCM (10) with respect to the reflector (15), the layer structure (2) being configured so as to electrically insulate the PCM (10) from the heating element (17), while the heating element (17) is in thermal communication with the
(Continued)

PCM (10) via the reflector (15) and the spacer (14); and a controller (19, 19a) configured to energize the heating element (17), so as to heat the PCM (10) and thereby reversibly change a refractive index and/or an absorption of said PCM (10). The invention is further directed to related optical devices (notably devices comprising one or more pixels formed, each, by a set of layer structures such as described above) and actuation methods.

18 Claims, 7 Drawing Sheets

(56) References Cited

U.S. PATENT DOCUMENTS

| | | | |
|---|---|---|---|
| 5,896,005 | A | 4/1999 | Gurvitch et al. |
| 2004/0041761 | A1 | 3/2004 | Sugita et al. |
| 2007/0125997 | A1 | 6/2007 | Kim |
| 2013/0265721 | A1 | 10/2013 | Strader et al. |
| 2015/0098032 | A1 | 4/2015 | Park |

FOREIGN PATENT DOCUMENTS

| | | |
|---|---|---|
| CN | 104730796 A | 6/2015 |
| EP | 0814366 A2 | 12/1997 |
| JP | S60-114830 A | 6/1985 |
| JP | 2004-070186 A | 3/2004 |
| WO | WO 98/33095 | 7/1998 |
| WO | WO 2015/097468 | 7/2015 |

OTHER PUBLICATIONS

Pernice, Wolfram H. P., et al., "Photonic Non-Volatile Memories Using Phase Change Materials", Applied Physics Letters, 101, 171101 (2012).
International Search Report for International Application No. PCT/IB2017/000041, dated May 2, 2017.
Written Opinion for International Application No. PCT/IB2017/000041, dated May 2, 2017.
First Office Action (Including Translation) for corresponding Chinese Patent Application No. 201780009930.5, dated Oct. 29, 2020.
Notification of Reasons for Refusal (including translation) for corresponding Japanese Patent Application No. 2018-560264 dated Jan. 19, 2021.
Second Office Action (Including Machine Translation) for corresponding Chinese Patent Application No. 201780009930.5, dated Apr. 12, 2021.

OPTICAL DEVICE WITH THERMALLY SWITCHING PHASE CHANGE MATERIAL

CROSS REFERENCE TO RELATED APPLICATIONS

This application is a national stage application under 35 U.S.C. 371 of PCT Application No. PCT/IB2017/000041, having an international filing date of 25 Jan. 2017, which designated the United States, which PCT application claimed the benefit of European Patent Application No. 16 000 280.4 filed 4 Feb. 2016, the contents of each of which are incorporated herein by reference in their entirety.

BACKGROUND

The invention relates in general to optical devices with applications in various fields ranging from pixels in displays to smart glass for architectural and automotive applications.

There has been considerable research into the so-called phase change material (PCM) technology and its use in optoelectronic devices such as ultra-high resolution reflective displays, see-through displays, and force sensors. PCMs include materials that can be switched between more than one phases. The phases may have different optoelectronic properties. Also, bi-stable PCMs are known, which are particularly attractive because it is not necessary to continuously apply power to maintain the device in a new state after a phase transition has completed.

However, only a tiny portion of material is generally actively involved in the electrical switching cycle of such materials, while the surrounding portion of material remains essentially unaffected. This phenomenon is known and often referred to as "filamentary switching". While filamentary switching can be advantageously exploited for some applications, this phenomenon will, as it may be realized, adversely impact optical properties between different switched states of the PCM.

This phenomenon typically occurs in crossbar circuit configurations. In a crossbar circuit, a voltage pulse is applied across the crossbar, leading to current flow through the PCM element between the bars. Localized conductive paths (i.e., "filaments") are created between electrodes by the switching process. Some non-optical, resistive devices can for instance be made to work satisfactorily even though only tiny portions of material are switched. However, in terms of optical properties, PCM pixels in a crossbar circuit configuration may not appear to be switched as the active portion is too small. Thus, filamentary switching hinder optical applications such as pixels in displays and smart glasses.

To solve this problem and achieve a larger switching portion, one may divide the PCM area into nanoscale pixels. However, this results in a drastic increase of the number of pixels. For instance, for display applications, as the switching mechanism requires application of sharp (e.g., nanosecond duration) electrical pulses, the above solution requires addressing a large number (typically millions) of pixels in sequence at very high speed. This, however, creates a new engineering challenge as the amount of computational and electrical power required by the electronic peripheral driving circuitry for addressing the pixels increases drastically with the number of pixels.

It is otherwise known to use heat pulse to switch a PCM. For instance, US2015098032 discloses a PCM display, where each PCM pixel is switched by an electrical heater element, which is in direct contact with the PCM. The PCM element creates a grey scale. Additional filter elements provide colour to a pixel.

SUMMARY

According to a first aspect, the present invention is embodied as an optical device. This device comprises a layer structure with: a thermally conducting, optical reflector; a thermally conducting (optical) spacer, which is transmissive to light and arranged above the reflector; and a phase change material, or PCM, arranged above the spacer and having at least two reversibly switchable states, in which the PCM exhibits two different values of refractive index and/or absorption. The reflector, the spacer and the PCM are successively stacked along a stacking direction of the layer structure. The optical device further comprises a heating element, opposite to the PCM with respect to the reflector. The layer structure is configured so as to electrically insulate the PCM from the heating element, while the heating element is in thermal communication with the PCM via the reflector and the spacer. The optical device also comprises a controller, which is configured to energize the heating element, so as to heat the PCM and thereby reversibly change a refractive index and/or an absorption of said PCM.

The structure of the above optical device is devised so as to leverage two optical functions, while allowing a large portion of the PCM to be switched. The heating element provides the switching capability. The optically active element containing the PCM is separated from the heating element by an electrically insulating barrier, which is nevertheless thermally conducting. This, as present Inventors have realized, makes it possible to switch a large portion of the PCM, while preserving an ordered sequence of layers of the optically active substructure (namely PCM—spacer—reflector). The reversibly switchable states cause the PCM to exhibit two different values of refractive index and/or absorption, allowing a first degree of freedom in terms of optical properties (first optical function). Concurrently, the thickness of the spacer can be adjusted (or varied from one layer structure to the other), which enables a second degree of freedom in terms of optical properties (second optical function). Indeed, this makes it possible to exploit the fact that the reflectivity will vary significantly as a function of wavelengths of light, because of interference effects which are dependent on the refractive index and/or absorption of the PCM and the thickness of the spacer. As a result, optical properties of the device can be tuned thanks to the spacer (e.g., to confer a "colour" to a subpixel), without requiring additional filters.

Preferred embodiments as listed below offer additional advantages, notably in terms of switching (to favour a large area of switching) and optical properties.

To start with, the device is preferably designed such that an average thickness of the reflector is between 50 nm and 1 µm; an average thickness of the spacer is between 40 nm and 300 nm; and an average thickness of the PCM is between 0.5 nm and 80 nm. Preferably though, the PCM has an average thickness that is between 3 nm and 15 nm.

Meanwhile, as the present approach allows a large PCM portion to be switched, a lateral dimension of the layer structure, perpendicularly to said stacking direction (z) may for instance be greater than or equal to 0.35 µm or, preferably, greater than or equal to 5 µm. Much larger lateral dimensions can in fact be contemplated.

Preferably, the device further comprises an electrically insulating material between the heating element and the reflector, arranged so as to essentially insulate, electrically, the reflector from the heating element.

In embodiments, the controller is further configured to apply a current and/or a voltage to the heating element, the latter being a resistive heating element, to energize the heating element, so as to heat the PCM and thereby reversibly change a refractive index and/or an absorption of the PCM.

Preferably, the device further comprises an electrically conducting layer, in which the heating element is intercalated, at the level of said layer structure, whereby two portions of the electrically conducting layer are on respective lateral sides of the heating element, in contact therewith and the controller comprises two terminals contacting a respective one of said two portions, to apply said current and/or voltage to the heating element.

The controller is for instance configured to energize the heating element, according to at least two distinct signals, so as for the heating element to apply at least two distinct heat pulses, respectively, and reversibly switch the PCM to said at least two switchable states, respectively.

In preferred embodiments, the PCM comprises one or more of the following compounds: GeSbTe, VOx, NbOx, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb.

Preferably though, the PCM comprises one of: $Ge_2Sb_2Te_5$, GeTe and $Ag_3In_4Sb_{76}Te_{17}$.

The heating element may for example comprise one or more of the following: NiCrSi, NiCr, W, TiW, Pt, Ta, Mo, Nb and Ir.

The present invention may further be embodied as an optical device comprising a set of layer structures, e.g., to form subpixels of pixels. To that aim, the device comprises a set of thermally conducting, optical reflectors, as well as a set of thermally conducting spacers, being each above a respective one of the reflectors, wherein the spacers have substantially different thicknesses and are, each, transmissive to light. It further comprises a set of phase change materials, or PCMs, each above a respective one of the spacers. The set of PCMs form, together with the sets of spacers and reflectors, a set of layer structures. Each of the PCMs has at least two, reversibly switchable states, in which it exhibits two different values of refractive index and/or absorption. The device also comprises a set of heating elements, each being arranged opposite to a respective one of the PCMs with respect to a respective one of reflectors, in thermal communication with said respective one of the PCMs via a respective one of the reflectors and a respective one of the spacers, but electrically insulated from said respective one of the PCMs. The controller is configured to independently energize the heating elements, so as to independently heat the PCMs and thereby reversibly change a refractive index and/or an absorption thereof, whereby the refractive index and/or the absorption of each of the PCMs is independently controllable via the controller.

Here the spacer portions are differently dimensioned to confer, for each of the structures (or subpixels), distinct wavelength-dependent reflectivities to light entering each subpixel. I.e., each subpixel may light up (thanks to PCM switching, upon energizing), but with a distinct colour (thanks, notably, to the distinct spacer thicknesses), without requiring additional filters or the like In embodiments, this device comprises a set of pixels, wherein each pixel comprises a set of layer structures such as described above.

The invention can further be embodied as a display device, comprising an optical device such as described in embodiments above. The various components are arranged so as to form a set of pixels, each having a layer structure. The layer structure notably includes a PCM and a heating element, consistently with optical devices described above. It may also include other components, e.g., forming a reflector and a spacer. Yet, various arrangements can be contemplated, such that the pixels may share some of their components, or not, as discussed later in detail. In all cases, the heating element is, in each pixel, electrically insulated from a respective PCM and in thermal communication therewith. The display device further comprises a controller that is configured to energize any of the pixels, so as to independently heat a PCM thereof to reversibly change its refractive index and/or absorption. In addition, the display device comprises an arrangement of pairs of electrodes, wherein each of the pairs of electrodes are in electrical communication with a heating element of one of the pixels, so as for each of the pixels to be individually addressable by the controller in the display device.

Preferably, each of the pairs of electrodes are in electrical communication with the heating element of one of the pixels through a via that extends parallel to the stacking direction z of the layer structure of said one of the pixel.

Said via may for instance be in electrical contact with a drain terminal of a thin-film transistor, or TFT, whose gate terminal and source terminal are in electrical contact with a respective electrode of said each of the pairs of electrodes, so as for a voltage applied at the gate terminal to control a current between the source terminal and the drain terminal of the TFT, in operation. In variants, a resistive switching element may be used.

In embodiments, the heating element of each pixel is further in electrical communication with a thermally conducting, optical reflector, through another via (which also extends parallel to the stacking direction z). The reflector is further electrically conducting, such that a current passing through the heating element can be drained through said optical reflector, in operation.

In other embodiments, the heating element of each pixel is in electrical communication with a common electrode of the display device, through another via (also extending parallel to z), wherein each of the vias extends between an average plane of the arrangement of pairs of electrodes and an average plane of said heating element. This way, a current passing through the heating element can be drained through the common electrode, in operation.

According to another aspect, the invention is embodied as a method for controlling an optical device according to embodiments. Basically, the method comprises repeatedly energizing, via the controller, a heating element of this optical device, so as to heat a PCM thereof, to reversibly change its refractive index and/or absorption.

Preferably, energizing comprises: energizing a heating element during a time duration $t_1$, to heat said PCM according to a first temporal heat profile and thereby switch said PCM from a first state to a second state; and subsequently energizing the heating element during a time duration $t_2$, to heat said PCM according to a second temporal heat profile and thereby switch said PCM back to the first state. Said first temporal heat profile exhibits a maximal temperature $T_1$ and said second temporal heat profile exhibits a maximal temperature $T_2$, with $t_1 > t_2$ and $T_2 > T_m > T_1 > T_c$, wherein $T_m$ and $T_c$ respectively correspond to a melting temperature and a crystallization temperature of said PCM.

Devices, apparatuses and methods embodying the present invention will now be described, by way of non-limiting examples, and in reference to the accompanying drawings.

BRIEF DESCRIPTION OF SEVERAL VIEWS OF THE DRAWINGS

In FIG. 10, continuous layers are used to form capping layers, the PCM layer and the spacer layer, whereas FIGS. 11 and 12 depicts shifted configuration, involving distinct layer portions.

Figure 1:
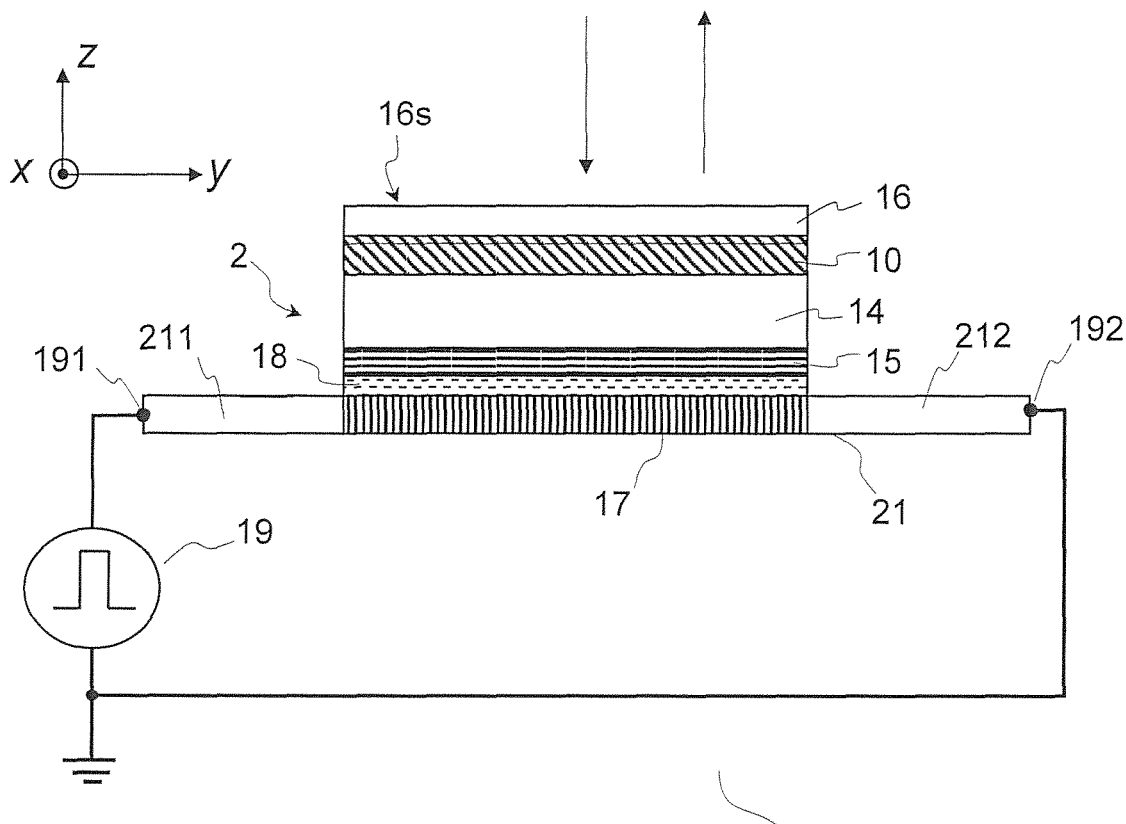
FIG. 1 is a two-dimensional (2D) cross-sectional view of an optical device, which can notably be designed as a large area PCM subpixel or pixel, according to embodiments.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

The following description is structured as follows. First, general embodiments and high-level variants are described (sect. 1). The next section addresses more specific embodiments and technical implementation details (sect. 2).

1. General Embodiments and High-Level Variants

Figure 2:
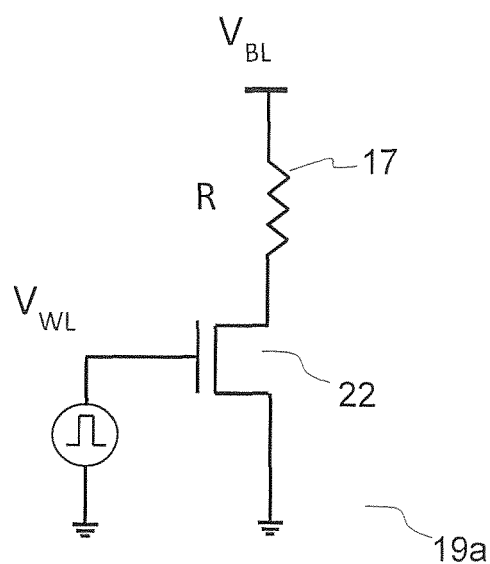
FIG. 2 depicts a variant to the switching circuit shown FIG. 1, involving a field effect transistor, which may be used to switch one or more devices such as depicted in FIG. 1, as involved in embodiments.
Figure 3:
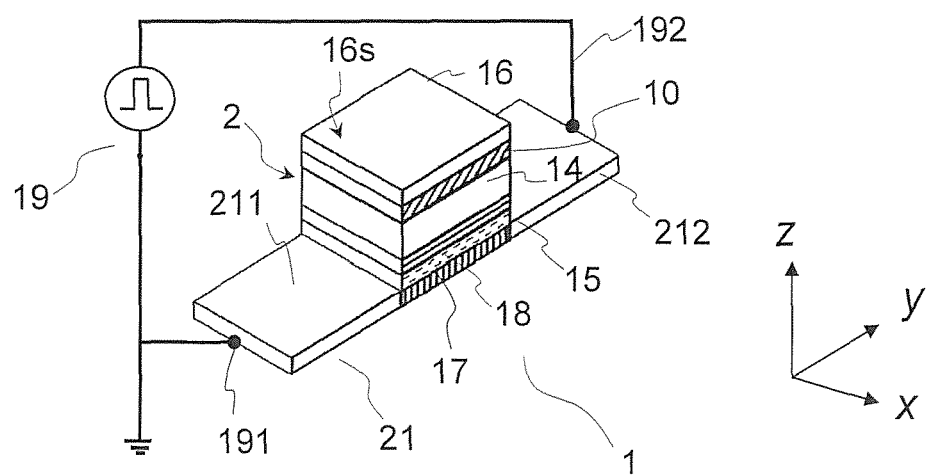
FIG. 3 is a three-dimensional (3D) view of the device of FIG. 1.

In reference to FIGS. 1-3, an aspect of the invention is first described, which concerns an optical device 1 comprising a single layer structure 2. Basically, the device 1 comprises an optical reflector 15, an optical spacer 14, a phase change material 10, or PCM, a heating element 17 and a controller 19, 19a.

The reflector 15 and the spacer 14 are both thermally conducting. The spacer 14 is transmissive to light and arranged above the reflector 15.

The PCM 10 is arranged above the spacer 14. It is selected so as to have two (or more) reversibly switchable states (preferably permanent), in which it exhibits two substantially different values of refractive index n (e.g., n differs by at least 0.2, as discussed below). More generally, the present PCMs could be chosen so as for its refractive index and/or its optical absorption to be switchable. PCMs as contemplated herein are reversibly switchable under application of a heat pulse. Such materials are known per se. Examples of materials that are best suited for the present purpose are discussed later. In the following though, the switching mechanisms described essentially refer to the refractive index properties of the PCMs, for simplicity.

Remarkably, the heating element 17 is located opposite to the PCM 10 with respect to the reflector 15, i.e., on the other side of the reflector 15, and thus is not in direct contact with the PCM. Still, as per the above configuration, the heating element 17 is in thermal communication with the PCM 10 via the reflector 15 and the spacer 14. However, the PCM 10 is electrically insulated from the heating element 17. An additional electrically insulating but thermally conducting layer 18 may be provided to that aim. In variants, the reflector may be designed as a dielectric mirror, as discussed below.

Furthermore, the controller 19, 19a is generally configured to energize the heating element 17, so as to heat the PCM 10 and thereby reversibly change a refractive index of the PCM 10. The controller 19 is typically configured to apply a current or voltage to the heating element 17, to heat the latter and thereby switch the PCM. When the heating element is heated, heat is quickly transmitted to the PCM via the reflector 15 and the spacer 14 (which both are thermally conducting), so as to heat the PCM and thereby allow it to be switched from one state to the other. Distinct signals may need be applied to switch the PCM to the various states.

Switching is here achieved thanks to a heating element 17 rather than by applying a voltage or current directly (or indirectly) to the PCM 10. The heating element is preferably provided as a layer, thereby completing the stack of layers 10, 14, 15. I.e., the heating element 17, the reflector 15, the spacer 14 and the PCM 10 are stacked as layers along the stacking direction z of the layer structure 2.

Note that the various elements 17, 15, 14 and 10 form a properly ordered sequence in the structure 2. Yet, such elements are not necessarily immediately consecutive. I.e., the sequence may comprise one or more additional layers inserted in the sequence, such as, e.g., layer 18, FIG. 1. Yet, any additional layer should have suitable physical properties so as to maintain the desired thermal path and electrical barrier between the heater 17 and PCM 10.

The layers 10-17 preferably all have the same lateral dimensions x, y (perpendicularly to the stacking direction z). The structure 2 may have substantially constant lateral dimensions along z, so as to form a compact, protruding structure 2, and thus favour uniform heat propagation along z. This, in turn, helps to achieve a uniform switching and optimize power consumption. However, it not critical to have substantially identical lateral dimensions in the layer stack, as in FIG. 1, as long as heat can be satisfactorily transferred to the PCM.

In particular, the lateral dimensions of the heating element 17 may essentially match those of the upper elements 10-15, or be slight larger, so as to favour heat transfer. The thicknesses of the various elements 17, 15, 14 can furthermore be chosen so as to optimize thermal properties. More generally, the present devices are designed so as to favour a uniform switching, over a large portion of the PCM 10 or, if possible over a major portion thereof.

Advantageously, the location of the heater 17 does not perturb the ordered sequence of layers 10-14-15, which can, in turn, be optimized in terms of their optical properties.

In particular, this allows the spacer thickness to be adjusted, e.g., for each subpixel, so as to leverage interference effects that depend on the refractive index of the PCM 10 and the thickness of the spacer 14, as noted in the summary section. Thus, there is no need to use colour filters. In preferred embodiments, the present devices are thus free of any colour filters, though such filters may be used, complementarily to the spacer, if needed, in variants. Moreover, present devices may include optical attenuators or electro-optical attenuators or, still, any filter configured to create the right display shade.

In addition, the heating element 17 need not be made transmissive to light, as it would if it were in direct contact with the PCM, i.e., above the reflector. It can instead be optimized in respect of its desired electrical/thermal properties (e.g., a high resistance). The heater is preferably intercalated in a low resistivity conducting layer 21, below the reflector 15, to optimize power conversion while energizing the layer 21 and minimize power consumption, as illustrated in FIG. 1. This further simplify the overall structure, inasmuch as the sole electrical contacts are on the backside of the structure 2, without electrodes sandwiching the active optical regions being needed.

Thanks to the present layer architecture, large subpixels can more easily be fabricated (and electrically addressed), each capable of providing a different colour. The heater is preferably chosen so as to have a low resistance and be actuated using standard CMOS technology. The present optical devices may typically be embodied as controlled subpixels or pixels in a display device. Subpixels may have spacers of substantially distinct thicknesses to provide for different colours, as discussed later in detail in reference to FIG. 7.

Note that the layers 10-17 need not necessarily be plane; they might instead be structured, although they will generally be stacked along stacking direction z. In particular, the heater may be structured to improve the temperature profile therethrough and, thus, the switching.

Typically, a transparent capping layer 16 is arranged on top of the PCM 10, a surface 16s of which defines the viewing surface, as seen in FIG. 1.

The thicknesses of the layers 14-18 are typically between 10 nm and 250 nm. Optimal thicknesses depend on the design size and the desired thermal coefficients. The thickness of the PCM 10 may, however, be between 0.5 nm and 500 nm, depending on the material actually used and the application sought. Yet, preferred PCM thicknesses are between 1 nm and 80 nm, which will, in general be sufficient to achieve the required optical properties. When using a PCM such as GST, GeTe (hereafter GT) or AIST (or a similar material), a sufficient thickness is typically between 3 and 15 nm, as discussed later.

A minimal degree of transparency is desired for layers 16, 10 and 14. At least 10% transmittance of incident light is typically needed. For the PCM layer, a minimum of 1% is typically needed. Exact values of transmittance depend on the actual thicknesses of the layers. The reflector 15 need typically be optically thick. E.g., if the reflector layer 15 may be essentially made of silver, and have a thickness of at least 60 nm and, preferably, of at least 100 nm. The reflector preferably has a reflectance of more than 80%, 90% or even 95%, on average, over the range of wavelengths of interest.

The lateral (average) dimensions of the structure 2 can for instance be of at least 0.35 µm. Still, the present approach allows, in principle, much larger dimensions, e.g., larger than 1, 5, 10, 50 or 100 µm. Devices having even larger lateral (average) dimensions can be contemplated, e.g., larger than 1, 10 or 100 mm. Relying on a heat induced switching allows larger portions to be switched, which, in turn, allows larger lateral dimensions. The lateral dimension of the layer structure depends strongly on the application, architecture and materials used.

Concerning properties of the PCM: a difference of at least 0.2 is typically needed for the refractive indices in the two states. For example, one may have $n=2.4$ in the high refractive index state and $n=1.6$ in the low refractive index state. The difference of refraction indices in the two states will typically range from 0.2 to 4. Typical values of refractive indices and extinction coefficients for GeSbTe and related materials can for instance be found in "W H P Pernice and H. Bhaskaran, Photonic non-volatile memories using phase change materials, Applied Physics Letters, 101, 011243 2012", see in particular FIG. 2a of the Pernice reference.

Figure 4:
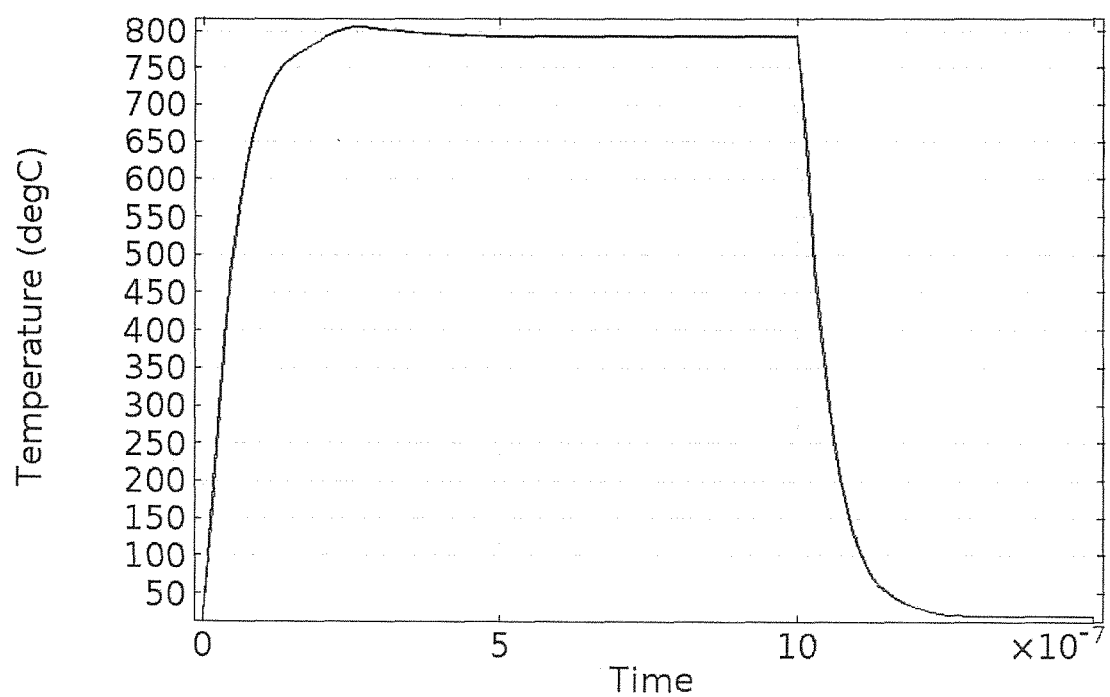
FIG. 4 is a plot of a temperature profile of a PCM element of a device such as depicted in FIG. 1 or 3, subject to a heat pulse caused by a fast current pulse applied to a heater element in thermal communication with the PCM element but electrically insulated therefrom, as obtained by a finite element thermal model.

The profile of temperatures that can be reached in the PCM may typically be in the range of 500-600° C. for GST, or even higher (>600° C.), as shown by simulations (see FIG. 4). Note that there is no practical way to measure the actual heat profile in the PCM (especially in the present context, where the PCM is insulated). It is material dependent, and not all materials switch at the same temperatures, whence the interest of simulations.

Preferred PCMs are materials that favour uniform (bulk) switching, i.e., involving a large portion of material in the switching process, as opposed to filamentary switching. Note that the formation of multiple (parallel) filaments may eventually amount to a bulk switching and convene as well. Yet, if the thickness of the PCM is too high, this may not ensure a proper switching, hence the need to restrict the thickness of the PCM layer, as exemplified below.

Preferably, present embodiments systematically use a reflector and do not require a backlight unit. Still, in variants, a backlight unit may be involved, be it for transmissive type reflective displays or other applications such as glazing or light modulation in transmission.

Several factors will contribute to improve the switching, as evoked above. Amongst other things, vertical dimensions of the layers 10-18 will impact uniformity of the switching. For instance, too thick a PCM may favour filamentary switching. Therefore, in embodiments, for typical PCMs as evoked herein, the average thickness of the PCM 10 is between 0.5 nm and 500 nm (and preferably between 1 nm and 80 nm, or even between 3 nm and 15 nm), to mitigate filamentary switching (closed interval are assumed throughout this description, i.e., including endpoints, unless otherwise stated). Meanwhile, restricting the thicknesses of intermediate layers 14, 15 allows better heat propagation (and thus requires less power). Therefore, the average thickness of the reflector 15 will typically be between 50 nm and 1 µm. Since the role of the spacer is to determine optical interference effects (which notably depend on the thickness of the latter), the thickness of the spacer is preferably restricted to be, on average, between 40 nm and 300 nm.

The above dimensional properties were generally found to not too severely impact heat propagation and favour uniform switching, especially where GST, GT or AIST (or a similar material) is used for the PCM. On the contrary, lateral dimensions are not limited, as said.

As evoked earlier, an electrically insulating material 18 is preferably provided between the heating element 17 and the reflector 15, so as to essentially insulate, electrically, the reflector 15 from the heating element 17. In variants, the reflector 15 may be designed as a dielectric mirror, so as to act as an electrical barrier. However, such a dielectric mirror may typically involve several layers of materials. Thus, it is often simpler to provide an electrically insulating layer 18 rather than to design a multilayer dielectric mirror.

As illustrated in FIGS. 1-3, the heating element 17 is preferably a resistive heating element 17 and the controller 19, 19a is configured to apply a current and/or a voltage to the heating element 17, to heat the latter and, in turn, to heat the PCM 10 and make it switch. Preferably a voltage pulse is applied, rather than a current. Although devices can be contemplated where one sources current, it can be more difficult, in practice, to source a current than a voltage in actual devices. The simple, exemplary electrical circuits 19 shown in FIGS. 1 and 3 make it possible to apply voltage pulses and thereby switch the PCM. More sophisticated actuations 19a may be contemplated, such as the FET circuit illustrated in FIG. 2, which is described in detail in sect. 2. In all cases, a crossbar circuit configuration is not needed and therefore not preferred.

As further illustrated in FIGS. 1, 3, the controller 19 may for instance comprises two terminals 191, 192 that contact, each, an electrically conducting layer 21, which comprises the heating element 17, so as to apply a voltage or a current to the heating element 17. This configuration simplifies the overall layer structure, as noted earlier (no need of crossbar configurations). As further seen in FIG. 1 or 3, the heating element 17 is preferably intercalated in the electrically conducting layer 21, at the level of the pillar structure 2, so as to "interrupt" the layer 21 and thus maximize power-to-heat conversion. Two residual portions 211, 212 of the electrically conducting layer 21 are arranged on respective lateral sides of the heating element 17, in contact therewith, which are contacted by one of the terminals 191, 192.

The above configuration, whereby a heater 17 is intercalated in a conducting layer 21, may form a basic component of an electrode arrangement for, e.g., a display device, involving a plurality of horizontal and/or vertical electrodes to address subpixels of the display. Note that, contrary to the geometry assumed in FIG. 1, the residual portions 211, 212 need not necessarily be arranged on opposite lateral sides of the heater 17. Instead of extending as a straight line, the elements 17, 21 may indeed be patterned in a different manner, e.g., to allow larger pixels to be heated.

In variants, the heater 17 can be formed as a serpentine (as assumed in the embodiments of FIGS. 8-12), instead of a layer portion. In that case, the serpentine is essentially arranged in a volume opposite to the PCM 10 with respect to the reflector 15 (just like the layer portion 17 in FIG. 1). A serpentine heater can be contacted by through vias extending through a substrate supporting the structure. The serpentine is preferably tightly coiled, so as distribute heat as uniformly as possible. FIGS. 8-12 are described later in detail.

At present, preferred PCMs are discussed. The PCM 10 may for instance comprises one or more of the following compounds: GeSbTe, VOx, NbOx, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb. Yet, other materials may be used, that comprise chemical combinations of elements cited above. In particular, the PCM may be a compound or an alloy of a combination of elements cited above, namely selected amongst Ag, Al, Au, Ga, Ge, In, Mn, Nb, O, S, Sb, Se, Sn, Te, and V.

Preferably though, the PCM 10 comprises $Ge_2Sb_2Te_5$ (known as GST). Another suitable material is $Ag_3In_4Sb_{76}Te_{17}$ (also known as AIST). In other examples, one may use GeTe (GT), preferably in non-equal proportion of Ge and Te, which may be advantageous as this allows slower crystallisation times for larger areas.

More generally, it is understood that various stoichiometric forms of the above materials may be contemplated. For example, several stoichiometric forms may be contemplated for $Ge_aSb_bTe_c$, where $\{a, b, c\}=\{1, 2, 4\}$, $\{4, 1, 5\}$, $\{8, 2, 11\}$, $\{6, 2, 9\}$ or $\{4, 2, 7\}$.

Furthermore, the PCM compound may comprise impurities and/or dopants. For example, it may be doped, e.g., with one or more of Si, C and N, which may be useful to better control parameters such as the transition temperature and transition speed.

The heating element 17 may for instance include a metal or metal alloy that exhibits resistivity and a substantially high thermal conductivity. For example, the resistive heater element 17 can be formed from Titanium nitride (TiN), Tantalum nitride (TaN), nickel chromium silicon (NiCrSi), nickel chromium (NiCr), Tungsten (W), Titanium-Tungsten (TiW), Platinum (Pt), Tantalum (Ta), Molybdenum (Mo), Niobium (Nb), or Iridium (Ir), or any of a variety of or a combination of similar metal or metal alloys that have the desired properties. The heater 17 has a melting temperature that is higher than the melting temperature of the PCM 10, to enable the necessary heat pulses.

Examples of potential materials for the electrically conductive layer 21 may be TiN, TaN, or Al.

The barrier layer 18 can notably be formed of $SiO_2$, SiN, AlN, Silicon Carbide (SiC), diamond (C) or any other material having suitable thermal conductivities and electrical resistivity.

Table I below gives an example of a combination of materials that may be used, in embodiments, together with their electrical conductivity (S/m) and their thermal conductivities (W/m.K).

TABLE I example of a combination of preferred materials for optical devices according to embodiments

| Element (layer) | Reference | Compound | Electrical conductivity | Thermal conductivity |
|---|---|---|---|---|
| Heater | 17 | Tin | $2 \cdot 10^5$ | 28.84 |
| Electrically conducting layer | 21 | NiCr | $10^6$ | 11 |
| Spacer, capping and insulating barrier | 14, 16, 18 | $SiO_2$ | 0 | 1.4 |
| Reflector | 15 | Ag | $61.6 \cdot 10^6$ | 429 |
| PCM (amorphous) | 10 | GST | 0.1 | 0.2 |
| PCM (Crystalline) | 10 | GST | $10^3$ | 0.5 |

Figure 7:
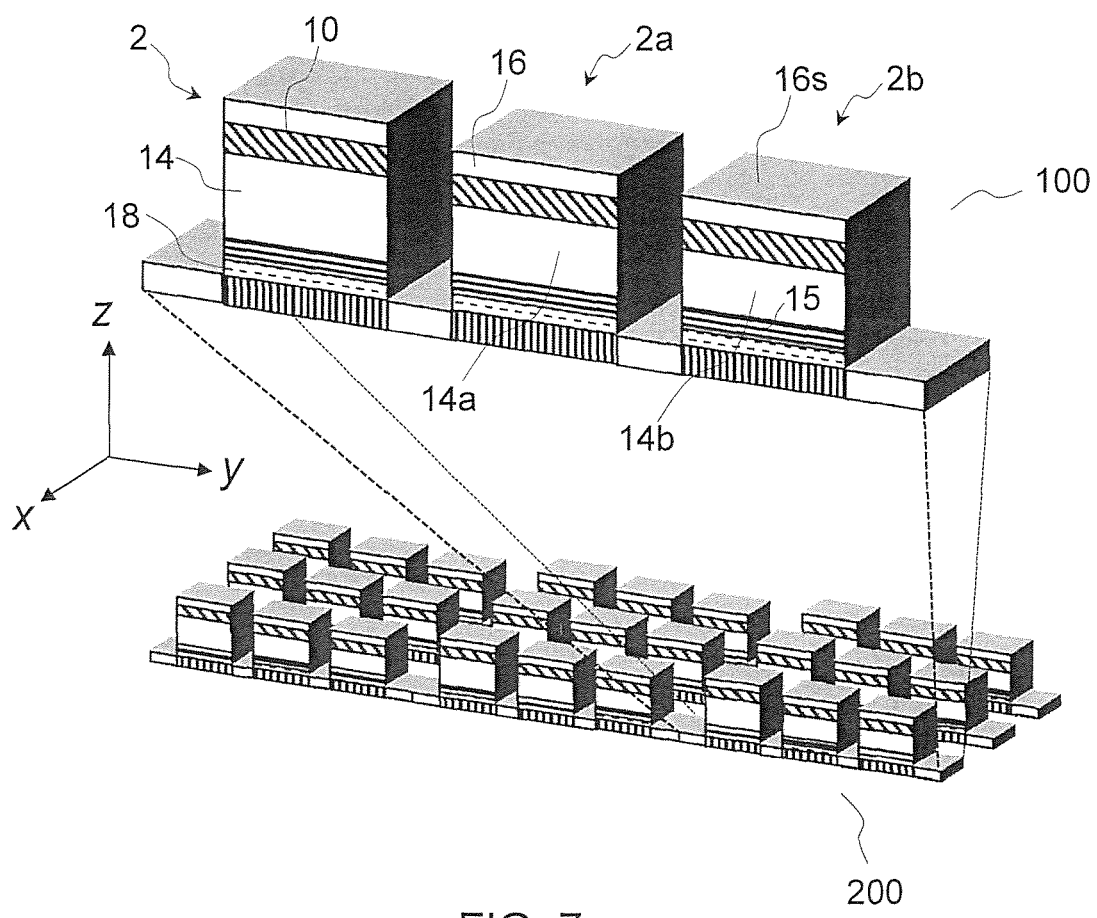
FIG. 7 illustrates an optical device comprising a 3×3 matrix of pixels, each comprising a set of subpixels, wherein the subpixels are designed, each, similarly as the optical device of FIG. 1, yet with different spacer thicknesses, according to embodiments.

Next, another optical device is described, which comprises several layer structures 2, 2a, and 2b. As illustrated in FIG. 7, such a device may comprise a set of structures 2, 2a, 2b to form, e.g., a pixel 100, as shown in FIG. 7, or several sets of structures 2, 2a, 2b to form a matrix 200 of pixels. A single device 100 comprises a set of thermally conducting spacers 14, 14a and 14b. As before, each spacer 4 lies above a reflector 15. Remarkably, the spacers have substantially different thicknesses. The device further comprises a set of phase change materials 10, or PCMs, forming, together with the spacers and the reflectors, layer structures 2, 2a, 2b. In each of the layer structures 2, 2a, 2b, a PCM 10 is arranged above a respective one of the spacers. As before, a PCM 10 has at least two, reversibly switchable states, in which it exhibits two different values of refractive index. Heating elements 17 are provided opposite to respective PCMs 10 and spacers 14, 14a, 14b, with respect to a reflector 15. Each heater 17 is in thermal communication with a respective PCM 10 via a spacer and a reflector but is, again, electrically insulated from its respective PCM 10, e.g., thanks to a barrier layer 18. A controller (not shown in FIG. 7) is further configured to independently energize the heating elements, so as to independently heat the PCMs and thereby reversibly change a refractive index thereof. As a result, the refractive index of each of the PCMs is independently controllable via the controller.

Again, a capping layer 16 may be provided, in each of the structures 2, 2a, 2b or as a single layer covering all structures (subpixels) 2, 2a, 2b.

Each structure 2, 2a, 2b comprises: a heater 17; a reflector 15, a spacer 14, 14a, 14b and a PCM 10 above the spacer, which are successively stacked along direction z. All the previous considerations (notably in terms of materials, thicknesses) discussed in reference to the single structure 2 of FIGS. 1 and 3 may equivalently apply to each of the structures 2, 2a and 2b.

In FIG. 7, the layer structures 2, 2a, 2b are assumed to be subpixels, which altogether form a pixel. A pixel may, in variants, comprises more than 3 subpixels.

Light enters and leaves through the top surface 16s of each subpixel, as in FIG. 1. Because of interference effects dependent on the refractive index of the PCM 10 and the thickness of each spacer 14, 14a, 14b, the reflectivity varies significantly as a function of wavelengths of light in each case, yet differently for each of the subpixels 2, 2a, 2b, as the thicknesses of the spacers differ. In other words, the spacer portions are differently dimensioned to confer, for each of the subpixel, distinct wavelength-dependent reflectivities to light entering each of the subpixels. I.e., each subpixel may light up (thanks to PCM switching), but with a distinct colour (thanks to the distinct spacer thicknesses), without requiring additional filters or the like.

As evoked above, in display applications, a device 200 will involve a set of pixels 100, each comprising a set of layer structures 2, 2a, 2b such as described above. An array of PCM pixels may for instance be fabricated on top of an array of FET/TFT devices. A modified control circuit 19a (as in FIG. 2) may be used to that aim, which involves, a FET 22 to control how heat is applied to the pixels. In variants, a PCM pixel array 200 may be embodied as a passive PCM display, using non-linear devices such as a Mott memristor as access devices.

In embodiments, the controllers 19, 19a shall preferably be configured to independently energize heating elements 17. Depending on the PCM used, each element 17 may need be energized according to two (or more) distinct signals, so as to apply two (or more) distinct heat pulses, to reversibly switch a PCM 10 to two (or more) switchable states, respectively. This will create two (or more) distinct temporal heat profiles $P_1$, $P_2$, as needed for reversibly switching the PCM 10 to two (or more) switchable states, as illustrated in FIGS. 5 and 6.

This is now described in detail in reference to another aspect of the invention, which can be embodied as a method for controlling an optical device such as described herein. Most basically, present methods revolve around repeatedly energizing, via a controller 19, 19a, a heating element 17, so as to heat a respective PCM 10 and reversibly change a refractive index of the latter.

As evoked above, the PCM may typically require to apply two (or more) distinct signals, so as to apply two (or more) distinct heat pulses.

Figure 5:
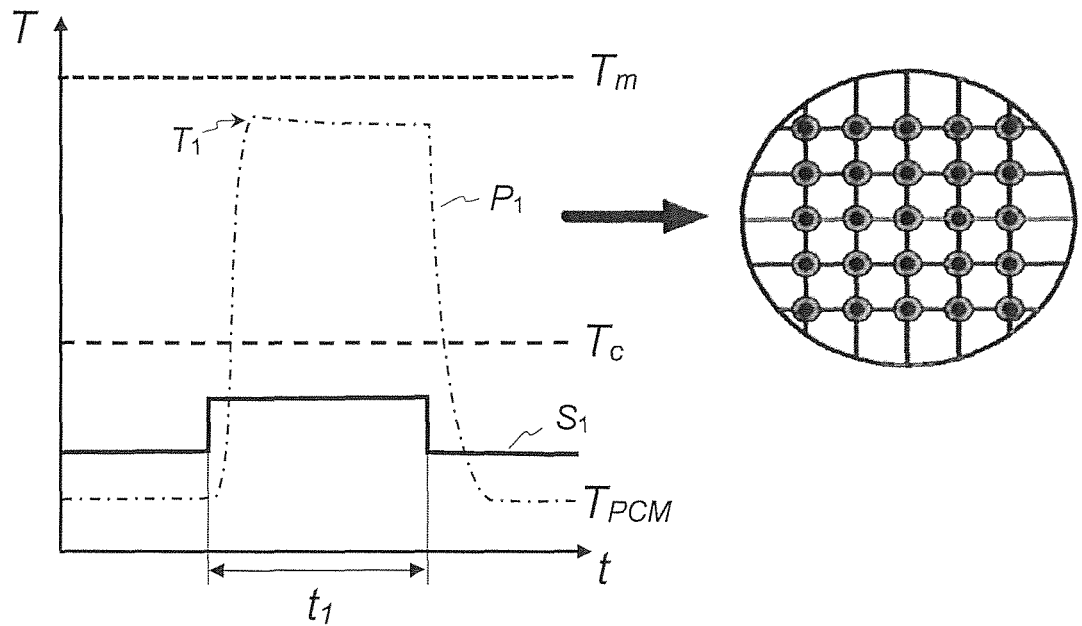
FIGS. 5 and 6 are graphs representing heat profiles as induced by control cycles of a heating element, so as to switch a PCM of an optical device according to embodiments to a crystalline state (FIG. 5) and back to an amorphous state (FIG. 6), as involved in embodiments.
Figure 6:
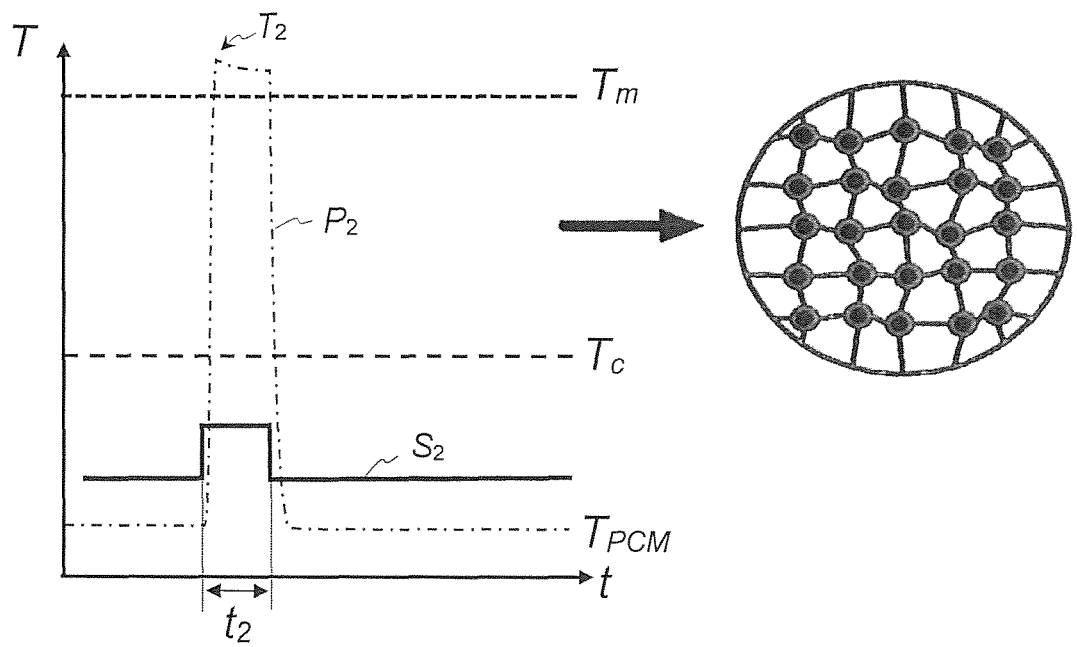

For instance, and as illustrated in FIG. 5, the controller may energize $S_1$ a heating element 17, during a time duration $t_1$, to heat said PCM according to a first temporal heat profile $P_1$ and thereby switch said PCM from a first (amorphous) state to a second (crystalline) state. Then, the controller may subsequently energize $S_2$ the heating element 17 during a time duration $t_2$, to heat said PCM according to a second temporal heat profile $P_2$ and thereby switch said PCM back to the first (amorphous) state. As seen in FIGS. 5 and 6, the first temporal heat profile $P_1$ exhibits a maximal temperature $T_1$ and the second profile $P_2$ exhibits a maximal temperature $T_2$. In addition, the following inequalities apply: $t_1 > t_2$ and $T_2 > T_m > T_1 > T_c$, where $T_m$ and $T_c$ respectively correspond to a melting temperature and a crystallization temperature of said PCM (see sect. 2).

In particular, the first signal $S_1$ applied (leading to $P_1$) may need be cautiously designed, so as for the time (call it $t_{fall}$) during which the temperature falls back from $T_1$ to $T_{PCM}$ to be long enough, e.g., at least 3 times longer than the re-amorphisation time (the time needed for the PCM to re-amorphise), to allow a stable crystallization.

The signals $S_1$, $S_2$ applied may be current pulses (as assumed in FIGS. 5 and 6), which, in variants, may have different amplitudes (contrary to the scenario assumed in FIGS. 5 and 6).

This, in turn, may impact the application times $t_1$ and $t_2$ required to adequately switch the PCM.

In other variants, one may prefer to apply a voltage pulse, for reasons discussed earlier.

Specific embodiments of the present methods are discussed in more detail in sect. 2, in respect of preferred optical devices.

By "amorphous", it is meant that the PCM 10 is, in its "amorphous" state, essentially non-crystalline and lacks long-range order. Short-range order may exist, but with substantial deviations of the interatomic distances and/or interbonding angles with respect to the known crystalline forms of this compound 10 (e.g., with at least 5% deviation). Now, "amorphous" should nevertheless be understood broadly, inasmuch as the compound 10 in its "amorphous" state may comprise small non-amorphous regions, e.g., microcrystalline or nanocrystalline regions. Notwithstanding, a PCM 10 in an amorphous state as contemplated herein is assumed to remain essentially (and possibly entirely) amorphous, that is, essentially non-crystalline.

Similarly, the PCM 10 is, in its "crystalline" state, essentially crystalline and exhibits long-range order. It will typically be polycrystalline, e.g., essentially made of microcrystalline or nanocrystalline regions. Yet, the compound 10 in its "crystalline" state may comprise small amorphous regions.

Although embodiments above refer to switchable states that correspond to (essentially) crystalline and (essentially) amorphous phases, one should keep in mind that a PCM may be operated, in embodiments, which is switchable between any two solid phases, including, but not limited to: crystalline to another crystalline or quasi-crystalline phase or vice-versa; amorphous to crystalline or quasi-crystalline/semi-ordered or vice versa, and all suitable forms in between (as long as corresponding states allow distinct refractive indices). In addition, more than just two states may be involved.

The invention may further be embodied as a display device. Example of display devices 1c-1f are schematically depicted in FIGS. 8-13. The present display devices 1c-1f typically involve several optical devices such as described earlier, so as to form a set of pixels, each having a layer structure 2c-2f. Yet, some of the components of the optical devices may be shared among pixels of the display devices, as discussed later in reference to FIGS. 10-12.

In all cases, the present display devices 1c-1f comprise pixels, whose layer structure 2c-2f includes at least a PCM 10 (or, at least, a switchable portion of a PCM layer) and a heating element 17, which is preferably configured as a serpentine, as evoked earlier. The heater is electrically insulated from the PCM 10 but in thermal communication therewith, consistently with principles already described.

Figure 13:
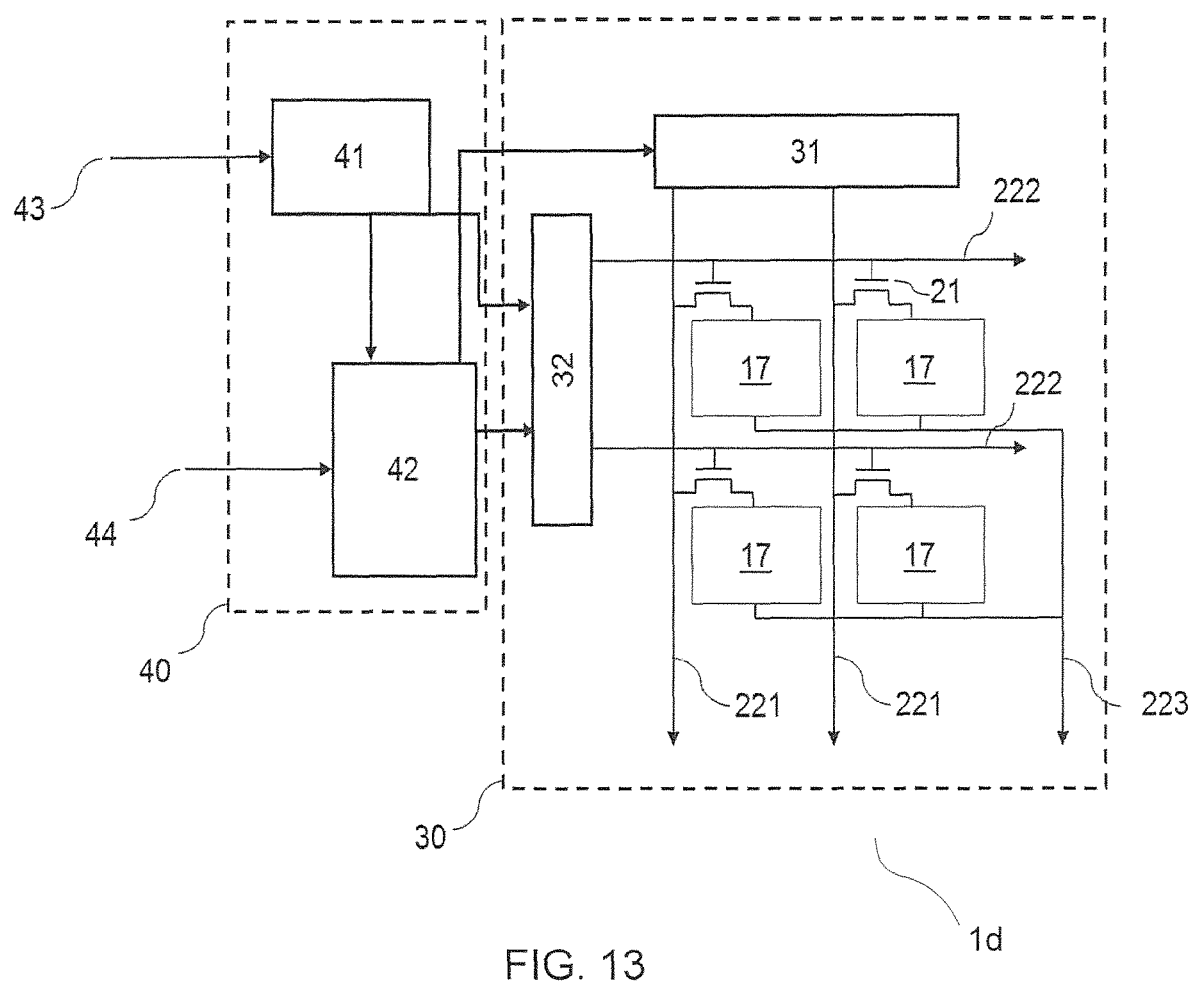
FIG. 13 is a schematic diagram of a display device, at system level, according to embodiments involving a common electrode, as in FIG. 9.

The present display devices further comprise a controller (comprising, e.g., elements 31, 32, 41, 42 such as depicted in FIG. 13) and, consistently with principles already described earlier, the controller can be used to energize any of the pixels, so as to independently heat a PCM thereof, to thereby reversibly change its refractive index.

In addition, such devices 1c-1f further comprises an arrangement of pairs of electrodes 221, 222, see FIG. 13, wherein each of the pairs of electrodes are electrical communication with a heating element 17 of one of the pixels 2c-2f, so as for each of the pixels to be individually addressable by the controller.

Preferably, transverse vias 41, 42 are used, so as to allow electrical communications to and from the heater 17, which, in turn, makes it possible to increase the (pixel) fill-factor, while remaining of relatively simple fabrication. Such a solution allows a matrix addressed array of PCM-based pixels to be obtained, wherein the row and column electrodes 221, 222 and other interconnection elements 41, 42 sit below the heater elements 17. The vias 41, 42 are typically embedded in one or more thermally conducting, yet electrically insulating barriers 18, 18a.

In particular, and as depicted in FIGS. 8-13, each of the pairs of electrodes is preferably in electrical communication with a heating element 17 (of one of the pixels 2c-2f) through a via 41 that extends parallel to a stacking direction z of the layer structures of the pixels.

In the examples of FIGS. 8-12, the transverse via 41 is in electrical contact with the drain terminal of a thin-film transistor 21 (hereafter TFT), whose gate terminal and source terminal are otherwise in electrical contact with a respective electrode 221, 222. Thus, voltage applied at the gate terminal can be used to control the current between the source terminal and the drain terminal of the TFT, in operation.

Figure 8:
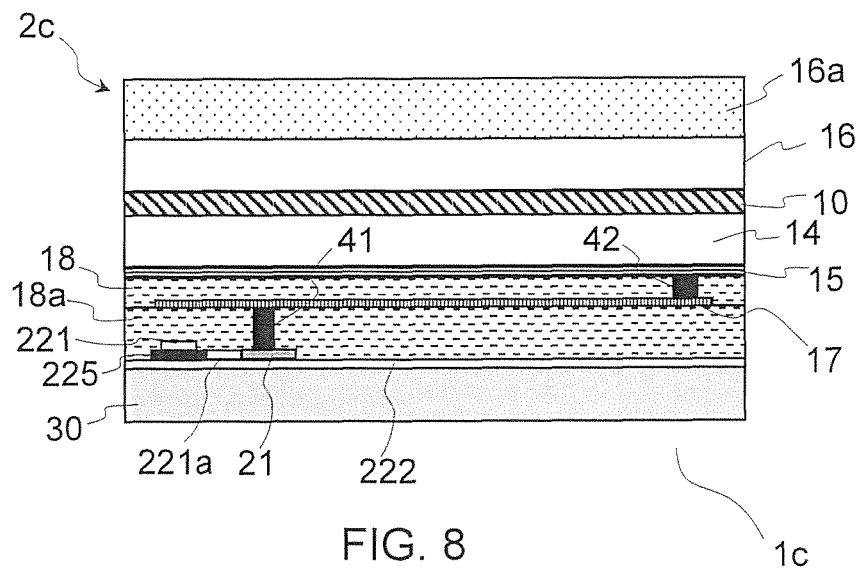
FIGS. 8 and 9 are two-dimensional (2D) cross-sectional views of optical devices, according to further embodiments involving an arrangement of transverse through-vias, where the heater current drains into the reflector (FIG. 8) or into a common electrode (FIG. 9)
Figure 9:
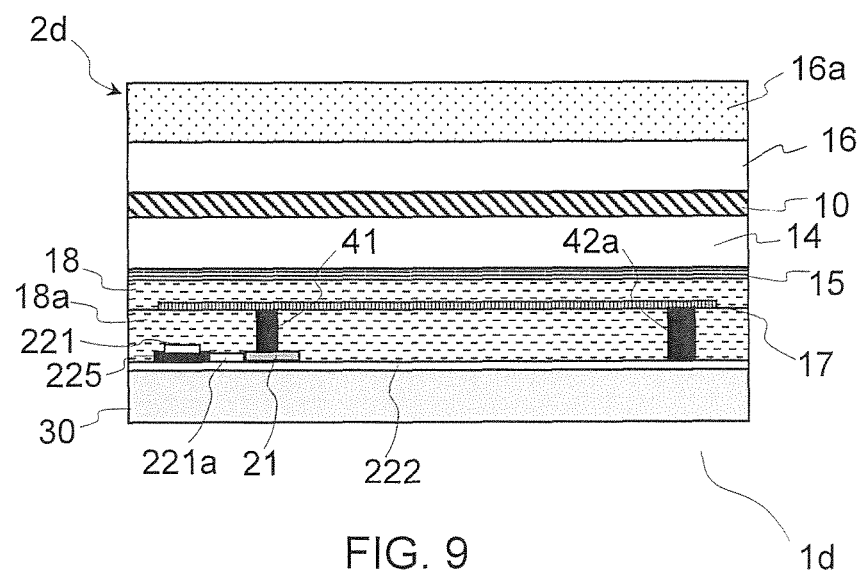

In the embodiments of FIGS. 8, 9, the TFT 21 is offset with respect to a crosspoint formed by electrodes 221, 222. Electrical communication is thus achieved thanks to auxiliary electrode arms, forming a junction with a respective one of the electrodes 221, 222. Only the arm 221a is visible in the cutting plane of FIGS. 8, 9.

It is necessary to insulate the crossing point of the row and column electrodes, e.g., using a dielectric element or bridge 225, as known. Insulation may, however, already be provided by a layer in which the electrodes are embedded. For example, the bridge 225 can be fabricated from a polymer material that is first lithographically fabricated over the column electrodes 222 at each crosspoint, e.g., in the form of a disc shape. The polymer disc is then heated past the glass transition temperature such that each disc forms a lenticular shape, which is then cooled. The fabrication of the row electrodes over the column electrodes and the bridge layer 225 then takes place, with the lenticular shape of the bridge 225 guiding the row electrodes over each crosspoint while minimising sharp gradients, which could else lead to increased resistance or failures. In variants, the bridge can be fabricated as an oxide or nitride (e.g., $Si_3N_4$), deposited through a mask.

In variants to TFTs, resistive switching elements could be used (not shown). In that case, the controller need be configured to energize the pixels via a respective, resistive switching element (or RSE), so as to switch the latter from a high-resistance state to a low resistance state, in order to energize a respective heating element in the pixel and, in turn, reversibly change a refractive index and/or an absorption of a respective PCM. Such variants make it possible to filter out parasitic currents or voltage signals, such as "sneak path" currents or leakage currents and the like, thanks to the RSEs. This, in turn, prevents inadvertent switching of the PCM elements. Such a solution is particularly beneficial for passive matrix addressing displays. The present display devices may, accordingly, optionally be embodied as passive matrix addressing displays.

Contrary to the PCMs 10, which are preferably bi-stable, the above RSEs need be monostable (with the high-resistance being the stable state). RSEs are known per se. Resistive switching refers to a physical phenomenon occurring in a material that suddenly changes its resistance under action of, e.g., a sufficient current or electric field, or any suitable form of localized heat.

Several classes of switching materials, ranging from metal oxides to chalcogenides, have been proposed in the past, which can be contemplated for the present purpose. The performances of these materials are notably appreciated in terms of power consumption, integration density potential, and endurance. The RSE can notably form part of the via 41 (in variants to TFTs 21, which are typically separately provided), or be in electrical contact therewith.

In further variants to TFTs, diodes or other thin-film electronic elements may be used to provide selectability of the current path though individual pixels.

In embodiments as depicted in FIGS. 8, 10-12, the display devices 1c, 1e, 1f rely on pairs of vertically shifted vias 41, 42. A first via 41 the transverse via 41 is in electrical contact with the drain terminal of the TFT 21, while the heating element 17 is in electrical communication with the reflector 15 through a second via 42. The via 42 also extends parallel to the stacking direction z of the layer structure. In that case, the reflector 15 is electrically conducting, such that a current passing through the heating element 17 can be drained through the reflector 15, in operation.

In variants, such as depicted in FIG. 9, the heating element 17 of the display device 1d is in electrical communication with a common electrode 223 (see FIG. 13), through via 42a. The latter also extends parallel to the stacking direction z of the layer structure. However, in the example of FIG. 9, each of the vias 41, 42a extends between the average plane of the electrodes 221, 222 and the average plane of the heating element 17 of the pixel 2d, which allows shallower devices to be obtained, in fine. In the embodiment of FIG. 9, the current passing through the heating element 17 is drained through the common electrode 223, in operation.

As touched earlier, some of the components of the present devices 1, 1a-1f may be shared. For example, in FIGS. 10 and 12, the display device 1c, 1f relies on a single, continuous PCM layer 10. Also, single, continuous layers are used to form the capping layers 16, 16a.

Thus, variants to FIG. 7 can be contemplated, in which a single, continuous PCM layer 10 is used in place of a set of distinct PCM portions. In fact, many variants can be contemplated. For instance, single, continuous layers can be used to form each of the spacer 14 and the reflector 15, as in FIG. 10. Yet, the thicknesses of the spacers 14 may be varied from one pixel to the other, to leverage interference effects as discussed earlier, as illustrated in FIGS. 11 and 12.

Figure 10:
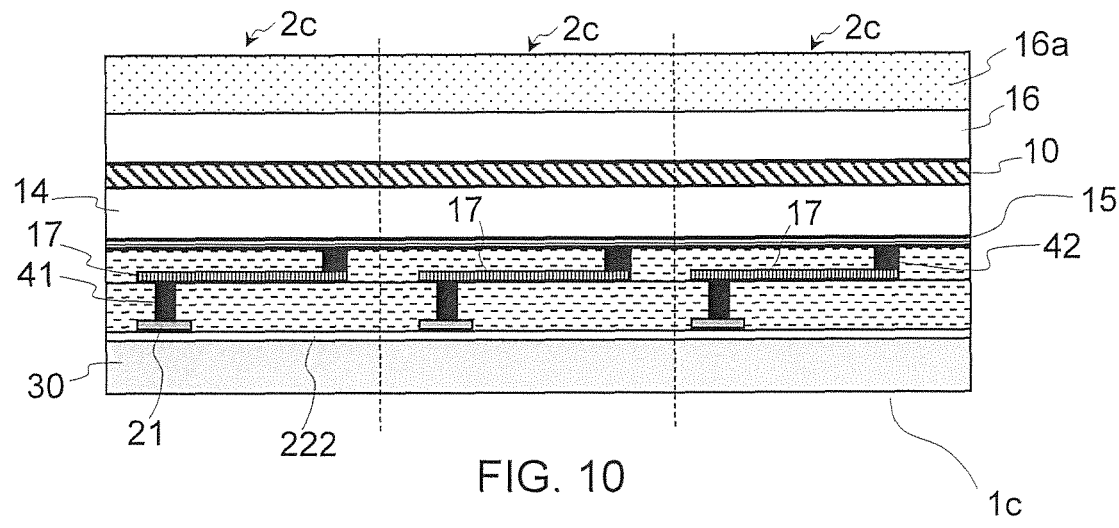
FIGS. 10-12 are two-dimensional (2D) cross-sectional (partial) views of display devices, according to embodiments, involving an arrangement of vertical through-vias, as in FIG. 8. In each case, three pixels (only) are depicted, for conciseness.
Figure 11:
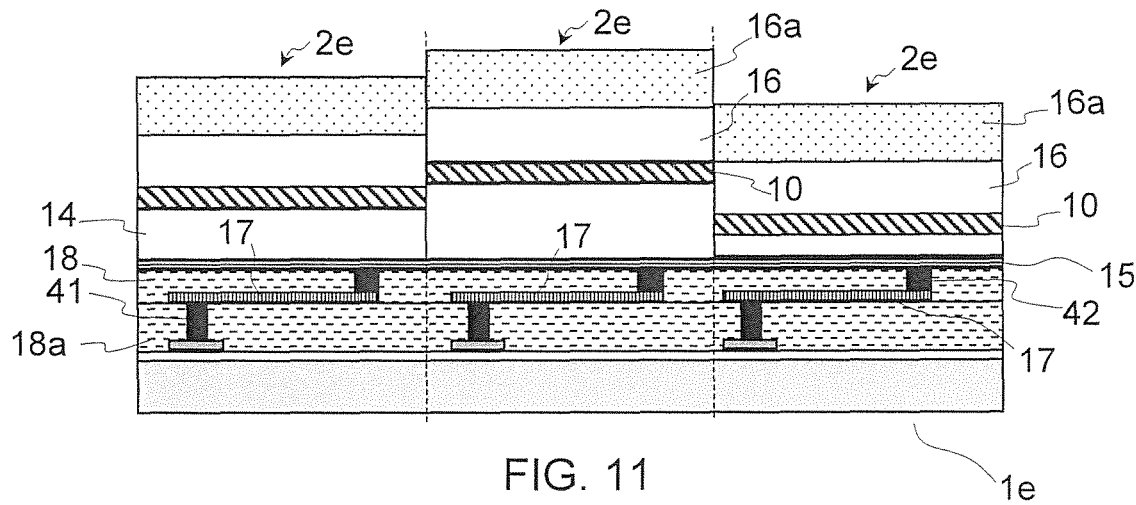
Figure 12:
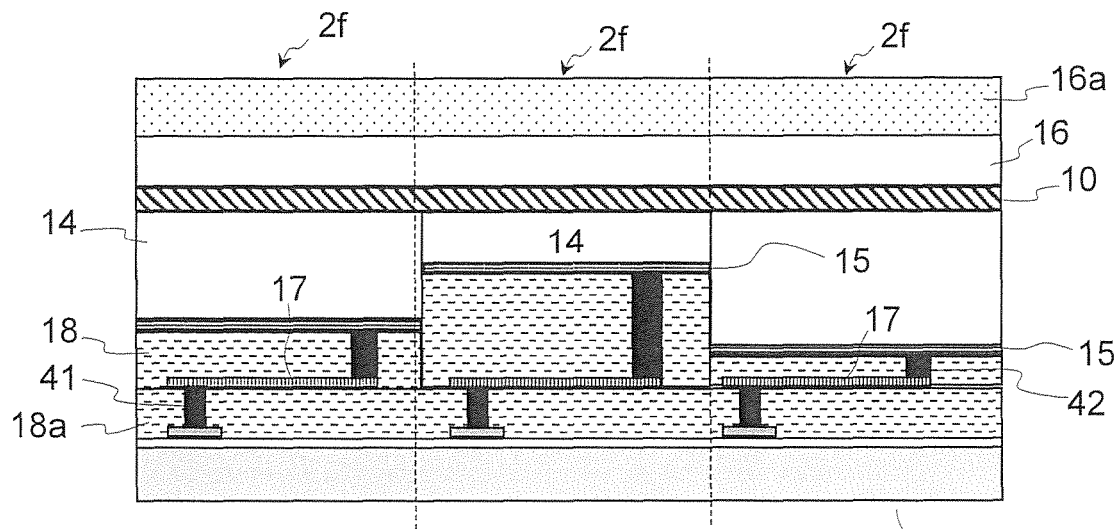

This gives rise to pixels of different heights in FIG. 11 (because here the reflector 15 is formed as a continuous layer and the lower structures 18, 18a, 41, 42 are repeated identically from one pixel to the other, as in FIG. 10). However, if reflectors 15 are vertically shifted (and thus formed by separate layer portions), the insulating layer portions 18 between the heaters 17 and the reflector 15s may have different thicknesses from one pixel (or sub-pixel) to the other, so as to compensate the different spacer layer thicknesses, as in FIG. 12. In the latter case, uniform PCM and capping layers can thus be deposited while the pixels would still produce different colours.

The capping layer 16 may for instance be of the same material as the lower spacers 14. Note that in FIGS. 8-12, optically thick or scattering capping layers 16a are deposited on top of the capping layer 16. More generally though, the capping layers 16, 16a may comprise composite layers, i.e., it may be formed of multiple layers of materials having different refractive indices, so as to achieve the desired optical properties. The same remark applies to the spacer layer (or the spacer layer portions).

For example, either or both of the spacer layer 14 and capping layer 16 may comprise "composite" layers of multiple layers of material having different refractive indices. In this way, further partial internal reflections are generated at the interfaces of these multiple layers, providing the possibility of more complex interference modes which may allow increased control of the reflection spectra of the available states. To that aim, the refractive index of the capping layer would typically be at least 1.6, and preferably at least 1.8, 2.0 or, even 2.2. This allows: (i) reflection spectra with high reflectivity to be generated over a narrow range of wavelengths, producing more vivid colours and thereby a larger colour gamut; and (ii) the desired reflection spectra to be more independently tuned in the multiple states of the device.

In fact, the skilled person will appreciate that most material layers (e.g., layers 10, 14, 15, 16, 17, 18, 18a) as evoked herein may in fact decompose into a stack of sublayers, if necessary structured, to achieve or improve a desired function. Even, the PCM layer(s) 10 may be decomposed as a set of superimposed PCM layer(s), made of a same material (or not), and wherein contiguous pairs of PCM layers may possibly be separated by a thermally conducting (but electrically insulating) layer.

The above embodiments have been succinctly described in reference to the accompanying drawings and may accommodate a number of variants. Several combinations of the above features may be contemplated. Examples are given in the next section.

2. Specific Embodiments—Technical Implementation Details

Specific embodiments of optical devices are now described, which obey the same fundamental principles disclosed in sect. 1. Namely, a heating element provides the switching capability, while the optically active element containing the PCM is separated from the heater by an electrically insulating but thermally conducting barrier.

An advantage of such structures is that each pixel can be switched across a micron-scale area, as typically required for display applications, or even (much) larger areas, as required, e.g., for smart glasses. The heater is typically placed below the optically active structure of PCM, spacer and mirror so as to partly decouple electrical and optical properties of the device. This allows much better design control over the optical properties, opening up many display applications which require RGB compatible colours with the requisite high contrast and saturation.

Finally, the interface engineering is more straightforward as there are no more concerns over, e.g., oxide formation at the PCM/Electrode (e.g., ITO) interfaces, while the heater can advantageously have a low resistance (compared with prior art solutions) and be actuated using standard CMOS technology.

2.1 Layer Structures

Specific embodiments are now described in reference to FIG. 1. A portion of active solid state material 10 is provided in the form of a layer. The material of this layer has a refractive index that is permanently, yet reversibly, changeable as a result of a transition from one phase to another. This material can thus be referred to as a phase change material, or PCM. Preferred PCMs are GST, GeTe or AIST, as discussed in sect. 1.

The PCM 10 is provided on a reflector 15, which is preferably a layer of metal such as platinum or aluminium. A spacer layer 14 is sandwiched between the PCM 10 and the reflector 15. A capping layer 16 is provided on top of the PCM 10. The upper surface 16s of layer 16 constitutes the viewing surface of the display device 1, and the reflector 15 is a back-reflector (no back-light unit is therefore required). Light enters and leaves through the viewing surface 16s as indicated by arrows. As noted earlier, because of interference effects which are dependent on the refractive index of the PCM 10 and the thickness of the spacer 14, the reflectivity varies significantly as a function of wavelengths of light, as illustrated further below. The spacer 14 and the capping layer 16 are both optically transmissive, and are ideally as transparent as possible.

Solutions are known (see, e.g., WO2015/097468 A1), where the spacer 14 and capping layer 16 are further configured as electrodes to apply a voltage to the PCM 10, sandwiched between these electrodes. In such a situation, the spacer 14 and the capping layer 16 have to be made of a transparent, electrically conductive material such as indium tin oxide (ITO). In the present approach, no such constraints are required and the materials of 16 and 14 can be optimally designed in respect of their sole optical properties. As it may be realized, this makes it possible to improve performances for RGB pixels in displays.

In the present solutions, the phase changes in the PCM 10 are generated by heat pulses from a resistive heater element 17. The layer stack 16, 10, 14, 15 is separated from the heater 17 by a barrier layer 18, which typically comprises $SiO_2$. The barrier layer 18 electrically insulates the heater 17 from the PCM element 20 but provides suitable thermal connection to the heater 17, see table I in sect. 1.

Heat from the heater 17 can thus pass through layer 18 to the PCM 10 to change the state of the PCM from a crystallized state to an amorphous state, and conversely, provided adequate heat profiles are applied, as explained earlier in reference to FIGS. 5 and 6.

The structure 2 shown in FIG. 1 can be provided on a substrate (below the layer 21, not shown) such as, e.g., a semiconductor wafer, $SiO_2$, or a flexible substrate such as a polymer film. Other types of wafers can be contemplated, if necessary, e.g., a glass panel.

The layers are typically deposited using sputtering, which can be performed at a relatively low temperature (e.g., of 100 Celsius). The layers can also be patterned using conventional lithography techniques or other techniques known, e.g., from printing. Additional layers may also be provided, if necessary.

In preferred embodiments, the PCM 10 is essentially composed of GST, is less than 80 nm thick, and preferably less than 15 nm thick, e.g., it has a thickness of 6 to 7 nm. The spacer layer 14 is grown to have a thickness typically in the range from 10 nm to 250 nm, depending on the colour and optical properties required, as discussed below. The capping layer 16 is, for example, 20 nm thick. The lateral dimensions of the heater 17 (and the whole structure 2) can for instance be 1 micron by 2 microns. More generally, the heater 17 and the upper stack of layers 18, 15, 14, 10 preferably have the same lateral dimensions, so as to "focus" heat toward the PCM layer and minimize heat transferred to the substrate, the electrodes, etc., which wastes energy.

The PCM 10, in this embodiment GST, can undergo a thermally induced reversible phase change. The resistive heater 17 is preferably designed so as to deliver a fast, nanosecond heat pulse to the PCM 10. Other materials and thickness are designed to avoid that too much heat be delivered to areas adjacent the heater and the PCM, which could otherwise cause parasitic switching.

FIG. 4 illustrates a finite element thermal model using the COMSOL multiphysics package, based on preferred parameters and materials as given above. In FIG. 4, the heater is subject to a 1 microsecond current pulse. A sharp temperature rise occurs due to Joule heating. FIG. 4 shows that the temperature profile (achieved in the layer stack, including the PCM) is sufficiently localised spatially, while having the correct sharp temporal pulse required for amorphisation of the PCM 10.

2.2 Switching Operations

Details of the switching operations are illustrated in FIGS. 5 and 6. As explained in sect. 1, the resistive heater element 17 can be configured to receive control signals to switch the PCM 10 between a crystalline state and an amorphous state. The resistive heater element 17 can include, for example, a metal or metal alloy material that exhibits resistivity and a substantially high thermal conductivity, as exemplified earlier. A signal can be provided as, for example, a current pulse $S_1$, $S_2$ to generate a corresponding heat profile from the resistive heater element 17 via Joule heating. Owing to the arrangement of the resistive heater element 17 with respect to the PCM 10, the heat profile can be thermally transferred to the PCM 10 to control the state of the PCM device.

The signals applied $S_1$, $S_2$ have pulse characteristics (amplitude and duration) that determine the heat profiles in the heater 17 and, in turn, the heat transferred to the PCM 10. For example, a signal $S_1$ with first characteristics is provided to the heater 17 while the PCM 10 is in an amorphous state, to set the PCM 10 to a crystalline state. For example, as illustrated in FIG. 5, the applied signal causes to generate a first temperature profile $P_1$ in the PCM (from the resistive heater element 17). In response to the application of the first signal to the heater 17, the latter generates heat that is conducted to the PCM 10 to induce a temperature $T_1$ greater than the crystallization temperature $T_c$, but less than the melting temperature $T_m$, and which remains greater than $T_c$ for a time sufficient to crystallize the PCM 10, as illustrated in the right-hand side diagram that schematically depicts PCM atoms arranged in a substantially crystalline (i.e., crystal lattice) structure.

Similarly, a signal $S_2$ with second characteristics can be provided while the PCM 10 is in a crystalline state, which generates a second heat profile $P_2$ in the PCM, to set the PCM 10 back to an amorphous state, as illustrated in FIG. 6. Here, in response to the application of the second signal to the resistive heater element 17, the resistive heater element 17 generates a second heat profile, whereby heat is conducted to the PCM 10. This results, in the PCM, in a temperature $T_2$ that is now greater than the melting temperature $T_m$, to induce a transition to a liquid phase.

Allowing the temperature to rapidly decay after the falling-edge of the applied pulse, results in solidification of PCM 10 in the amorphous state.

The applied pulses can be adjusted and refined, e.g., by trial and error, and based on all the relevant parameters, starting with the nature of the materials 17, 18, 15, 14, 10 and their dimensions. In that respect, the materials 14, 16, 18 may be selected and designed (especially in terms of thickness) so as to have thermal and electrical properties that ensure a rapid dissipation of the heat from the PCM 10, be it to mitigate the recrystallization of the PCM 10 subsequent to melting (during the amorphisation process).

The embodiments of FIGS. 5 and 6 assume that each signal applied is a single pulse. Subsequent to its application, the PCM 10 remains stable in one of the crystalline state and the amorphous state. As a result, the PCM is held in a given optical state without it being needed to maintain power, leading to significantly less power consumption than typical display technologies. Switching can in principle be performed a limitless number of times. The switching speed is very high, typically less than 300 ns, i.e., much faster than the human eye can perceive. Furthermore, PCM pixels built according to the present approach may have a relatively large area, for example 5×10 microns or even larger, as required for the application. The active area of such a pixel, as compared with the empty space around it, is much larger than a typical crossbar type pixel, which may typically be 100 nm across and separated by 100 nm, leading to a 1:1 pixel to empty space ratio. In comparison, embodiments can be contemplated, wherein, e.g., pixels have, each, lateral dimensions of 100×100 μm and are separated by 0.5 μm, leading to a 200:1 pixel to empty space ratio. Thus, large area pixels according to embodiments can be significantly more efficient, in terms of optical performance, than prior art devices.

2.3 Control Circuit

As seen in FIGS. 1-3, a controller 19, 19a can be provided to apply the required voltage/current for the necessary durations to switch the material layer 10. The controller can comprise specific electronic circuitry driven by microprocessors. Some (e.g., components 191, 192, 211, 212) or, in variants, all of the circuitry of the controller can be provided integrated onto a substrate with the optical layers of FIG. 1, or can be provided as separate dedicated circuitry.

It will be appreciated that any display incorporating PCM (sub)pixels as disclosed herein will need to be configured as an array of devices in multiple layers and that such devices must be capable of being electronically switched. Present optical devices are, in general, compatible with standard microelectronic device switches such as a conventional Field Effect Transistor (FET) or, alternatively, a TFT (as evoked in sect. 1), as routinely employed in LCD displays. An exemplary switching circuit 19a is illustrated in FIG. 2.

An appropriate nano- to microsecond pulse is applied as a voltage $V_{WL}$ from the word-line to the gate of the FET 22 in FIG. 2. This causes a current flow along the bit line from $V_{BL}$ and through the resistive heater 17. Joule heating then switches the PCM 10 as described above. Switching between amorphous and crystalline states can be achieved by varying the time period of the pulse as described above. It will be appreciated that other arrangements are known in the art which are also compatible with present devices.

In the embodiment of FIG. 13, the controller decomposes into control electronics 40 and components 31, 32 arranged directly on the display substrate 30. The control electronics comprises a DC/DC converter 41 (i.e., a voltage converter), receiving DC power 43 in input, and control integrated circuits, or ICs, typically embodied as application-specific integrated circuits, or ASIC 42. The IC 42 receives data signal 44 in input and controls, on the one hand, the gate driver ICs 32, connected to the row line (electrodes) 222, and, on the other hand, the column driver ICs 31, connected to the column line (electrodes) 221. Each pair of line-column lines connects here to a TFT 21, which, in turn, connects to a via 41 (see FIGS. 8-12), so as to control current to be passed through the heaters 17, in operation.

2.4 Pixelated Optical Shutter

In addition, the present devices may also be combined with other light modulation or display devices. For example, in order to allow the switchable colour reflection of present devices to appear black (for high contrast image display), they could be combined with an additional pixelated optical shutter positioned between the devices and the viewer. This additional optical shutter could have independently addressable pixel regions in registration with the pixels of the switchable reflective device, which selectively transmit or absorb light. In this way, the shutter either allows the coloured reflection produced by the optical device to be observed by the viewer, or blocks it so as to appear black.

The shutter may provide variable degrees of transmission so as to allow graduated control (greyscale) of the amount of coloured reflection which is transmitted.

The additional shutter may be operated by an additional controller in a co-ordinated manner with a controller as described earlier. In variant, the controllers 19, 19a, and 31-42 could be augmented so as to be able to determine the state required for the additional shutter at each pixel to display the intended image, and, in addition, control the switchable reflection state.

The additional shutter could be provided by a number of device types which allow switching in a spatially controlled manner between a transmissive and absorbing state, for example liquid crystal display devices (LCD), polariser free LCDs (including dye-doped and or chiral LCDs), bistable LCDs, electrowetting or electrophoretic devices.

In the case where the additional shutter comprises two substrates that sandwich the active electro-optic material (as is the case with LCD and electrowetting devise), embodiments of a switchable reflective device may be contemplated, which comprise the lower (furthest form viewer) substrate of the additional shutter device, which simplifies the manufacture and allow the overall thickness of the combined device to be reduced.

2.5 Advantages of Present Solutions for Display Applications

As discussed in the Summary, the present approach allows two optical functions. The heating element provides the switching capability, to change the refractive index of the PCM. Yet, the location of the heater makes it possible to preserve an ordered sequence of layers in the optically active substructure (PCM—spacer—reflector), where the spacer thickness can be set so as to confer a "colour" to a subpixel, without requiring additional filters. Considerations evoked in WO2015/097468 in respect of the optically active substructure (PCM—spacer—reflector) applies equally here.

As demonstrated in a prior patent application (WO2015/097468), a display device based on layered structures can be made to appear a uniform colour, which can then be switched to appear a contrasting colour, or to appear much darker or lighter by changing the reflectivity. This can be achieved in the present case too, thanks to the location of the heater and electrical insulation between the latter and PCM. Accordingly, display device may, in embodiments, involve several structures 2, 2a, 2b, as illustrated in FIG. 7, fabricated adjacent to each other in an array 200, with each structure 2, 2a, 2b being individually electrically controllable and constituting a subpixel of a pixel 100 of the overall display 200. The spacers 14, 14a, 14b in each structure 2, 2a, 2b within the cluster 100 may have a different thickness. In variants, devices may be designed so as for each pixel to comprise a single structure 2 such as that of FIG. 1, this structure being individually electrically controllable.

Unlike prior art solutions, the present approach (relying on bulk PCM switching) allows contrast and colour saturation suitable for an RGB display to be achieved. On the contrary, solutions such as disclosed in WO2015/097468 suffer from limitations due to: (i) electrical requirements for the capping and spacer layers (which constrain, in turn, the optimisation of optical parameters); and (ii) the electrical switching, which constrains the size of the pixels (or equivalently the active area of a pixel).

Thus, the present invention can advantageously be embodied as an RGB display, leading to both excellent colour saturation and contrast, suitably sized pixels, while lowering power consumption (owing to permanent switchable states). Preliminary tests have for instance shown that a pixel according to embodiments may reduce power consumption by a factor of more than 100, possibly 300, compared to traditional RGB pixels. Keeping in mind the number of RGB display in use today, one understands the potential benefits of present embodiments in terms of power consumption can be huge.

Suitable red, green and blue devices can be obtained, according to tests performed a colour space for 0, 30 and 60 degree viewing angles, and for pixel 'ON' and pixel 'OFF' states.

Display devices embodying the invention can be produced that have low power consumption, but provide a high-resolution, colour display (the resolution being only limited by the lithographic techniques used). The display devices can switch at high rates (and, thus, can appropriately be applied to video signals) and have a wide viewing angle. The devices can be fabricated using standard techniques, and can be made very thin, and also flexible if desired.

2.6 Other Applications

The devices described above can, in general, be used in the fabrication of (sub)pixels in displays, smart glasses for architectural and automotive applications.

In addition, optical devices as described herein may be used in: switchable mirrors (including automotive mirrors), active security tags (for documentation or product packaging, which may provide a visual response to RF or NFC inputs that are detected by the controller), reconfigurable input devices (e.g., keyboards, or low power notification/status displays for mobile, wearable, or internet of things devices).

The resulting devices can be distributed by the fabricator in raw form (that is, as a single product that has multiple unpackaged devices) or in a packaged form. In any case the device can then be integrated with other devices, discrete circuit elements, and/or other signal processing devices as part of either (a) an intermediate product or (b) an end product. The end product can be any product that includes an optical device such as described above, ranging from low-end applications to advanced products.

The invention claimed is:

1. An optical device comprising a layer structure including:
   a set of thermally conducting optical reflectors;
   a set of thermally conducting spacers, each above a respective one of the reflectors, wherein the spacers have substantially different thickness and are each transmissive to light;
   a set of phase change materials, or PCMs, each above a respective one of the spacers, so as to form, together with said set of spacers and said set of reflectors, a set of layer structures, wherein each of the PCMs has at least two, reversibly switchable states, in which each of the PCMs exhibits two different values of refractive index, wherein each respective reflector, spacer and PCM are successively stacked along a stacking direction of the layer structure;
   a set of heating elements, each being:
      arranged opposite to a respective one of the PCMs with respect to a respective one of reflectors;
      in thermal communication with said respective one of the PCMs via a respective one of the reflectors and a respective one of the spacers; and
      electrically insulated from said respective one of the PCMs, and,
   a controller configured to independently energize the heating elements, so as to independently heat the PCMs and thereby reversibly change a refractive index and/or an absorption thereof, whereby the refractive index and/or the absorption of each of the PCMs is independently controllable via the controller.

2. The optical device of claim 1, wherein:
   an average thickness of each reflector is between 50 nm and 1 μm;
   an average thickness of each spacer is between 40 nm and 300 nm; and
   an average thickness of each PCM is between 0.5 nm and 80 nm.

3. A device according to claim 1, wherein
   a lateral dimension of the layer structure, perpendicularly to said stacking direction is greater than or equal to 0.35 μm.

4. A device according to claim 1, further comprising;
   an electrically insulating material between each heating element and each reflector, arranged so as to essentially insulate, electrically, the reflector from each heating element.

5. A device according to claim 1, wherein
   the controller is configured to apply a current and/or a voltage to the heating elements, the latter being resistive heating elements, to energize the heating elements, so as to heat the PCMs and thereby reversibly change a refractive index and/or an absorption of said PCMs.

6. A device according to claim 5, wherein:
   the device further comprises an electrically conducting layer, in which the heating element is intercalated, at the level of said layer structure, whereby two portions of the electrically conducting layer are on respective lateral sides of one heating element, in contact therewith; and
   the controller comprises two terminals contacting a respective one of said two portions, to apply said current and/or voltage to the one heating element.

7. A device according to claim 1, wherein
   the controller is configured to energize the set of heating elements, according to at least two distinct signals, so as for the set of heating elements to apply at least two distinct heat pulses, respectively, and reversibly switch the PCMs to said at least two switchable states, respectively.

8. A device according to claim 1, wherein
   the PCMs comprises one or more of the following compounds: GeSbTe, VOx, NbOx, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb.

9. A device according to claim 1, wherein
   the PCMs comprise one of: $Ge_2Sb_2Te_5$; GeTe; and $Ag_3In_4Sb_{76}Te_{17}$.

10. A device according to claim 1, wherein
    the PCMs has an average thickness that is between 3 nm and 15 nm.

11. A device according to claim 1, wherein
    each heating element comprises one or more of the following: NiCrSi, NiCr, W, TiW, Pt, Ta, Mo, Nb and Ir.

12. A device according to claim 1, further comprising
    a set of pixels, each of said pixel comprising a set of layer structures such as said set of layer structures.

13. A display device, comprising a device according to claim 1, so as to form a set of pixels, each having a layer structure that includes:
    said PCMs; and
    said set of heating elements, the latter electrically insulated from the PCMs and in thermal communication with the PCMs in the layer structure,
    and wherein the display device further comprises:
    said controller, the latter configured to energize any of the pixels, so as to independently heat a PCM of said any of the pixels and thereby reversibly change a refractive index and/or an absorption thereof; and
    an arrangement of pairs of electrodes, each of the pairs of electrodes in electrical communication with a heating element of one of the pixels, so as for each of the pixels to be individually addressable by the controller in the display device.

14. The display device according to claim 13, wherein
    each of the pairs of electrodes are in electrical communication with the heating element of one of the pixels through a via extending parallel to a stacking direction of the layer structure of said one of the pixel.

15. The display device according to claim 14, wherein
    said via is in electrical contact with a drain terminal of a thin-film transistor, or TFT, whose gate terminal and source terminal are in electrical contact with a respective electrode of said each of the pairs of electrodes, so as for a voltage applied at the gate terminal to control a current between the source terminal and the drain terminal of the TFT, in operation.

16. A method for controlling an optical device as in claim 1, the method comprising
    repeatedly energizing, via the controller, a heating element of said optical device, so as to heat a PCM of the optical device, to reversibly change a refractive index and/or an absorption of said PCM.

17. The method according to claim 16, wherein repeatedly energizing comprises:

energizing, during a time duration $t_1$, a heating element, to heat said PCM according to a first temporal heat profile and thereby switch said PCM from a first state to a second state; and subsequently energizing, during a time duration $t_2$, the heating element, to heat said PCM according to a second temporal heat profile and thereby switch said PCM back to the first state, wherein, said first temporal heat profile exhibits a maximal temperature $T_1$ and said second temporal heat profile exhibits a maximal temperature $T_2$, with $t_1 > t_2$ and $T_2 > T_m > T_1 > T_c$, wherein $T_m$ and $T_c$ respectively correspond to a melting temperature and a crystallization temperature of said PCM.

18. A display device comprising an optical device forming a set of pixels, each pixel having a layer structure that includes:

a thermally conducting optical reflector;

a thermally conducting spacer, which is transmissive to light and arranged above the reflector;

a phase change material, or PCM, arranged above the spacer and having at least two reversibly switchable states, in which the PCM exhibits two different values of refractive index, wherein, the reflector, the spacer and the PCM are successively stacked along a stacking direction of the layer structure, and wherein the layer structure further comprises:

a heating element, opposite to the PCM with respect to the reflector, the layer structure being configured so as to electrically insulate the PCM from the heating element, while the heating element is in thermal communication with the PCM via the reflector and the spacer; and a controller configured to energize any of the heating elements, so as to independently heat the PCM of said any of the pixels and thereby reversibly change a refractive index and/or an absorption of said PCM; and an arrangement of pairs of electrodes, each of the pairs of electrodes in electrical communication with a heating element of one of the pixels, so as for each of the pixels to be individually addressable by the controller in the display device, wherein:

said heating element is further in electrical communication with a thermally conducting, optical reflector, through a via, which extends parallel to a stacking direction of the layer structure of a pixel, the reflector being further electrically conducting, whereby a current passing through the heating element can be drained through said optical reflector, in operation, or said heating element is further in electrical communication with a common electrode of the display device, through a via, the latter extending parallel to a stacking direction of the layer structure of a pixel, the via extending between an average plane of said arrangement of pairs of electrodes and an average plane of the heating element of said one of the pixels, whereby a current passing through the heating element can be drained through the common electrode, in operation.

* * * * *